United States Patent
Lu et al.

(10) Patent No.: US 10,428,418 B2
(45) Date of Patent: Oct. 1, 2019

(54) METAL MATERIAL AND A METHOD FOR USE IN FABRICATING THEREOF

(71) Applicant: City University of Hong Kong, Kowloon (HK)

(72) Inventors: Jian Lu, Kowloon (HK); Ge Wu, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 0 days.

(21) Appl. No.: 15/349,318

(22) Filed: Nov. 11, 2016

(65) Prior Publication Data

US 2018/0135162 A1 May 17, 2018

(51) Int. Cl.
| | |
|---|---|
| *B32B 15/04* | (2006.01) |
| *C23C 14/18* | (2006.01) |
| *C23C 14/16* | (2006.01) |
| *C23C 14/34* | (2006.01) |
| *C23C 14/35* | (2006.01) |
| *C22C 30/02* | (2006.01) |
| *C22C 1/02* | (2006.01) |

(52) U.S. Cl.
CPC .............. *C23C 14/185* (2013.01); *C22C 1/02* (2013.01); *C22C 30/02* (2013.01); *C23C 14/165* (2013.01); *C23C 14/3414* (2013.01); *C23C 14/35* (2013.01)

(58) Field of Classification Search
None
See application file for complete search history.

(56) References Cited

U.S. PATENT DOCUMENTS

2006/0266442 A1\* 11/2006 Narayan ................ B82Y 30/00
148/437
2010/0154942 A1\* 6/2010 Branagan ................ C22C 45/02
148/543

FOREIGN PATENT DOCUMENTS

CN 101220444 \* 7/2008 ............. B22D 21/00

\* cited by examiner

*Primary Examiner* — Seth Dumbris
(74) *Attorney, Agent, or Firm* — Renner Kenner Grieve Bobak Taylor & Weber

(57) ABSTRACT

A metal material including a plurality of metal particles arranged in a crystal structure having at least two phases; wherein the at least two phases include a crystalline phase and an amorphous phase, wherein the crystalline phase includes a nanocrystalline phase and the amorphous phase includes a nanoamorphous phase.

15 Claims, 15 Drawing Sheets

US 10,428,418 B2

METAL MATERIAL AND A METHOD FOR USE IN FABRICATING THEREOF

TECHNICAL FIELD

The present invention relates to a metal material and a method for use in fabricating thereof, and particularly, although not exclusively, to a metal material and a method for use in fabricating thereof by depositing a metal layer in a magnetron sputtering process.

BACKGROUND

A material's strength reflects the ability to withstand an applied load without failure or plastic deformation. Every material is unique and thus each possesses a different set of strength. In the study of material strength, the tensile strength, compressive strength, and shear strength are analyzed independently. The tensile strength to resists from being pulled apart, for example by tension, may be measured by the maximum stress that a material can withstand while being stretched or pulled before breaking.

Some materials may be highly brittle and break sharply without any indication of plastic deformation, while some materials, especially metal, are ductile in general and may experience at least a certain degree of elastic deformation, further plastic deformation, and even necking before eventually fracture. Accordingly, it is of great importance for studying the tensile strength of the less ductile materials, thereby adopting these materials to the right applications.

SUMMARY OF THE INVENTION

In accordance with a first aspect of the present invention, there is provided a metal material comprising a plurality of metal particles arranged in a crystal structure having at least two phases; wherein the at least two phases include a crystalline phase and an amorphous phase.

In an embodiment of the first aspect, the crystalline phase includes a nanocrystalline phase and the amorphous phase includes a nanoamorphous phase.

In an embodiment of the first aspect, the plurality of metal particles are arranged to form a plurality of spherical crystalline structures.

In an embodiment of the first aspect, the plurality of metal particles are further arranged to form a plurality of amorphous shells.

In an embodiment of the first aspect, at least a portion of the plurality spherical crystalline structure is surrounded by an amorphous shell.

In an embodiment of the first aspect, the plurality of spherical crystalline structures are substantially free of dislocation.

In an embodiment of the first aspect, each of the plurality of amorphous shells includes a size smaller than or equal to 10 nm.

In an embodiment of the first aspect, a plurality of spherical crystalline structures includes a size smaller than or equal to 10 nm.

In an embodiment of the first aspect, a ratio between a portion of metal particles arranged in the crystalline phase and a portion of metal particles arranged in the amorphous phase is substantially ranged at 1:2 to 2:1.

In an embodiment of the first aspect, the ratio is substantially equal to 1:1.

In an embodiment of the first aspect, the at least two phases are distributed uniformly in three dimensional directions in the crystal structure.

In an embodiment of the first aspect, the crystal structure includes a material strength higher than or equal to E/20, wherein E represents an elastic modulus of the metal material.

In an embodiment of the first aspect, the crystal structure is arranged to sustain a maximum stress of 3.3 GPa.

In an embodiment of the first aspect, the crystal structure includes a metallic glass structure.

In an embodiment of the first aspect, the plurality of metal particles include magnesium.

In an embodiment of the first aspect, the plurality of metal particles further includes at least one of yttrium and copper.

In an embodiment of the first aspect, the crystalline phase is copper-rich and the amorphous phase is magnesium-rich.

In accordance with a second aspect of the present invention, there is provided a method for use in fabricating a metal material, comprising the step of depositing a metal layer comprising a plurality of metal particles on a substrate; wherein the plurality of metal particles are arranged in a crystal structure having at least two phases; and wherein the at least two phases include a crystalline phase and an amorphous phase.

In an embodiment of the second aspect, the metal layer is deposited in a magnetron sputtering process.

In an embodiment of the second aspect, a magnesium alloy target is used in the magnetron sputtering process.

In an embodiment of the second aspect, the magnesium alloy target comprises magnesium, yttrium and copper.

In an embodiment of the second aspect, an atomic ratio of magnesium, copper and yttrium is equal to 65:25:10.

In an embodiment of the second aspect, the magnesium alloy target is fabricated by smelting.

In an embodiment of the second aspect, the magnetron sputtering process includes the following parameters:
Vacuum pressure: $\leq 1\times 10^{-4}$ Pa;
Argon pressure: 0.2-0.5 Pa;
Substrate bias: −50-−100 V; and
Substrate temperature: 100-200° C.

In an embodiment of the second aspect, the substrate includes at least one of a silicon substrate, a glass substrate and a metal substrate.

In an embodiment of the second aspect, the step of depositing the metal layer comprises the step of adjusting a substrate temperature during the deposition process.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Figure 1A:
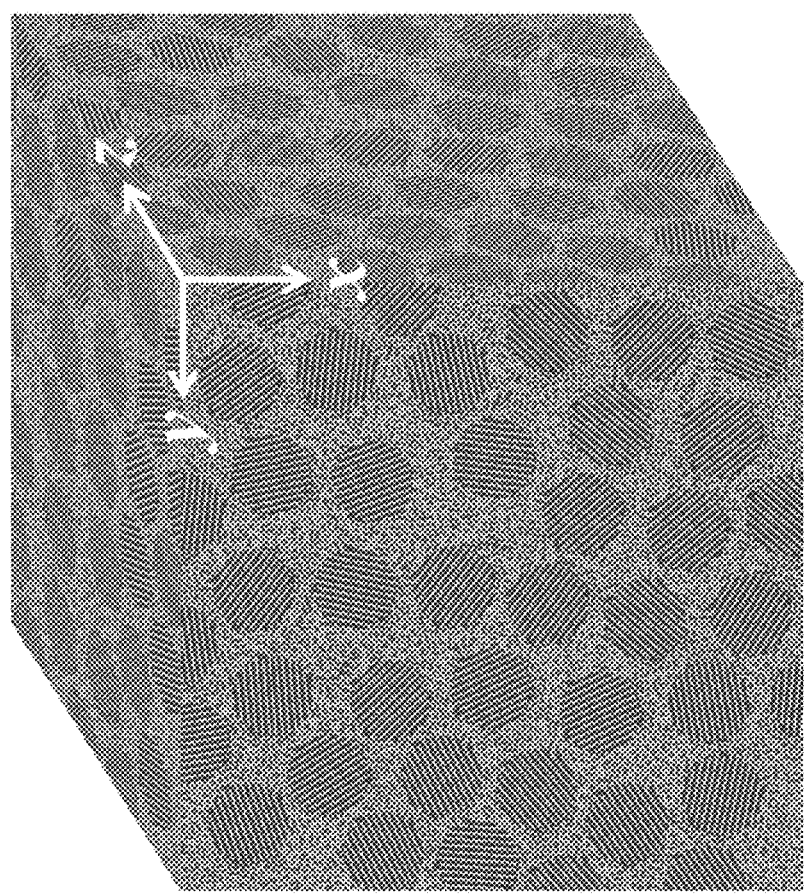
FIG. 1a is a schematic drawing of the nano-dual-phase structure in accordance with the invention.

Without wishing to be bound by theory, the inventors, through their own research via trials and experimentation, have discovered that existing strengthening mechanism such as grain or interphase boundaries strengthening, twin boundaries strengthening, solid solution strengthening and precipitates or dispersed reinforcement particles strengthening may only prevent dislocation based on controlling the defects for impeding the motion of the dislocations. However, these effects cannot be increased unlimitedly. Introducing too many defects could cause the dominated deformation mechanism changing from dislocation related processes to defects softening behavior.

For example, when the grain size is less than 10 nm, plastic deformation mechanism may be dominated by grain boundary slidding and grain boundary softening, thereby causing the occurrence of reverse Hall-Petch effect. For an around 500 nm-sized fine grain copper with twin spacing smaller than 15 nm, its strength would also decrease as a result of that preexisting easy dislocation sources at twin boundaries, and grain boundaries dominate the plastic deformation instead of the slip transfer across the twin boundary. As such, the strength of the nanocrystalline or nanotwinned materials may generally falls into the regime of $\sigma \approx E/85$, where $\sigma$ is the strength and E is the elastic modulus.

Alternatively, amorphazation may be another efficient way to increase the material strength because such amorphous structure has no weak points, such as grain boundaries or dislocations. For instance, the strength of metallic glasses generally falls into the regime of $\sigma \approx E/50$, and in general, its strength is much higher than that of their crystalline counterpart. However, as devised by the inventors, the ultimate stress of metallic glass may only be kept in the strain of 2%, due to the shear band softening effect by the shear strain localization in the plastic deformation process. As such, even the strength of the amorphous materials may not reach the ideal regime of $\sigma \approx E/20$ either.

The near-ideal strength materials generally exist in single crystal whiskers, crystalline nanowire or nano-sized metallic glass, which contain very few defects. However, the fabrication method for the near-ideal strength materials are in general very harsh and complicated, which has by far limited their substantial applications. Although amorphous materials or nanocrystalline materials are easier to be fabricated and possess very high strength, the development of a process to produce large sized material, which can reach the theoretical strength, is very challenging.

To mitigate or alleviate at least part of the aforesaid problems, the inventors have devised a structure with theoretical strength materials and a large area fabricating method. Such material has a grain size of smaller than 10 nm and expanded amorphous grain boundary with several nanometers. The amorphous shells may impede the gliding of the grains and the motion of dislocations, preventing the occurrence of the reverse Hall-Petch effect. Furthermore, the nanosized amorphous shells may also have theoretical strength. Therefore, such nano-dual-phase glass-crystal (NDP-GC) material may reach the theoretical strength and fall into the regime of $\sigma \approx E/20$.

In one example embodiment, the Mg-based NDP-GC deposited by magnetron sputtering has a 3 dimensional homogeneous structure, which reveals the approximately 6-nm-diameter $MgCu_2$ nanocrystals being embedded into the approximately 2-nm-thick Mg-enriched amorphous shells. Preferably, the hardness of the Mg-based NDP-GC is 6.5 GPa, which is the highest among the most known Mg-based metallic materials, and the strength is 3.3 GPa, which has reached the theoretical strength of the Mg-based materials.

Advantageously, the ultrahigh strength originates from the quasi "dislocation free" nanocrystals and fully relaxed glasses. The deformation mechanism is dominated by the main shear band arresting by the $MgCu_2$ nanocrystals, followed by the embryonic shear bands multiplication and strain hardening of $MgCu_2$ nanocrystals.

As discovered by the inventors, Mg-based NDP-GC has an important implication in improving the mechanical properties of the metallic materials. It would also be a promising material applied in surface coating with high wear resistance, high strength MEMS and 3D printing structures using the techniques of lithography or focus ion beam (FIB).

With refer to FIG. 1a, there is provided a metal material 100 comprising a plurality of metal particles arranged in a crystal structure having at least two phases; wherein the at least two phases include a crystalline phase and an amorphous phase. In this embodiment, the metal material 100 preferably comprises a plurality of metal particles selected from a combination of magnesium, yttrium and copper. These metal particles may be arranged in a crystal structure, for example a metallic glass structure, with at least a crystalline phase and an amorphous phase. For instance, the grains with the lattice structure are the crystalline phases, and the material between the grains is the amorphous phase, as shown in FIG. 1a. With different combination of metal particles selected for the crystalline phase and an amorphous phase, the crystalline phase 10 may be copper-rich and an amorphous phase may be magnesium-rich, and vice versa.

Each of the two phases may be further processed to provide two finer phases including a nanocrystalline phase and a nanoamorphous phase respectively. Accordingly, the nanocrystalline phase may be provided in a spherical arrangement to form crystalline structures 12, for example forming a cubic crystal. Such spherical crystalline structures 12 may be surrounded by amorphous shells 22 formed by the nanoamorphous phase. Advantageously, these spherical crystalline structures 12 may be substantially free of dislocation, with the spaces between the adjacent spherical crystalline structures 12 being filled by the amorphous shells 22.

Each of the spherical crystalline structures 12 and the amorphous shells 22 may have a size smaller than or equal to 10 nm. For instance, the volume fraction of the spherical crystalline structures 12 to the amorphous shells 22 within the metal material 100 may be within a ratio ranged from 1:2 to 2:1, and more preferably around 1:1, to distribute the spherical crystalline structures 12 and the amorphous shells 22 uniformly in a three dimensional directions.

Figure 1B:
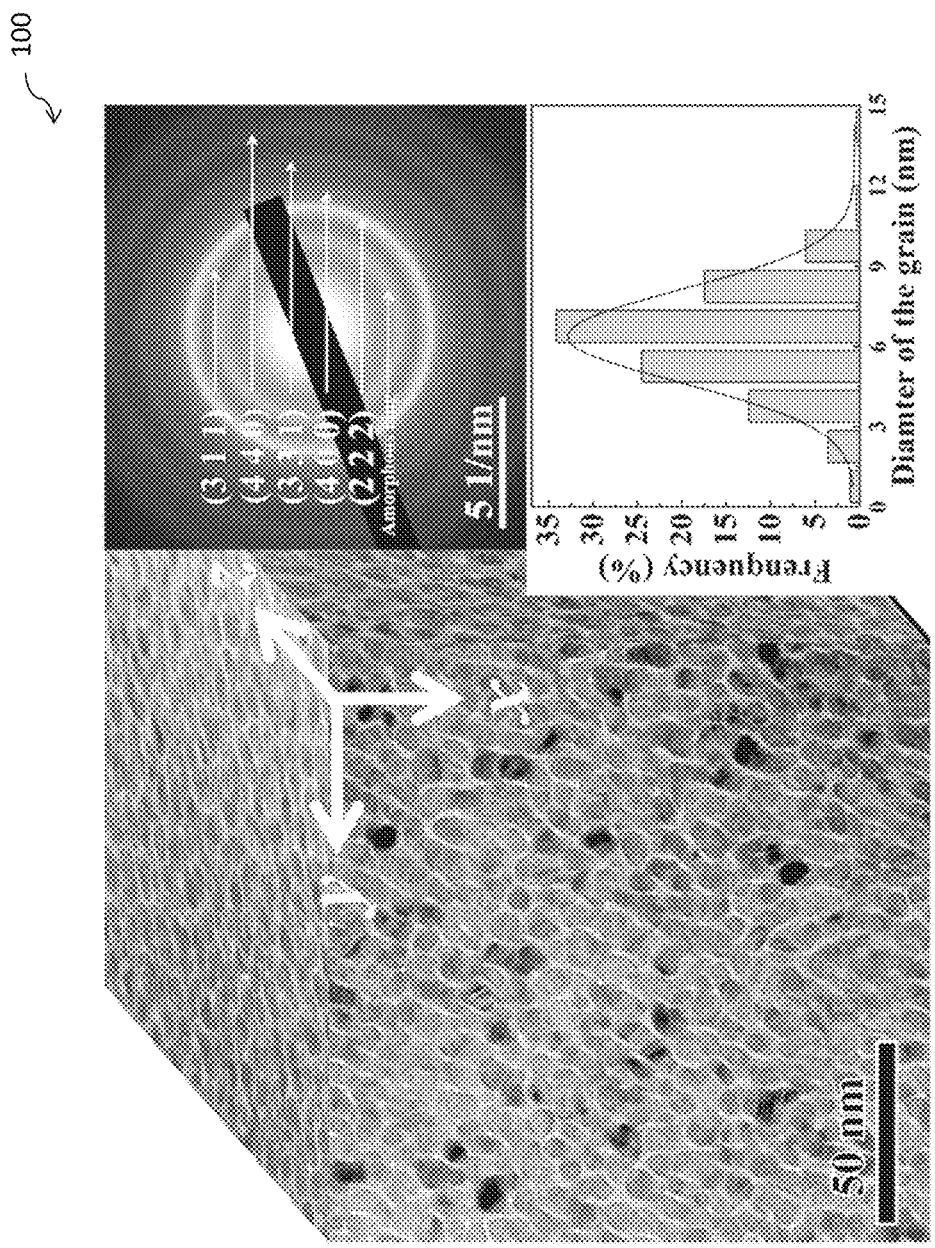
FIG. 1b is a three dimensional re-constructed TEM image of the Mg-based NDP-GC, together with the SAED pattern and the grain size distribution in accordance with the invention.

In one example embodiment, a Mg-based NDP-GC has an amorphous-nanocrystalline dual-phase structure of approximately 6-nm-sized $MgCu_2$ phases being uniformly embedded in the around 2-nm-thick Mg-enriched amorphous shells being fabricated by magnetron sputtering, as shown in FIG. 1b. In FIG. 1b, the xy plane indicates the surface of the sample, and the z axis indicates the depth from the surface.

Preferably, the selected area electron diffraction pattern (SAED) shows an amorphous ring and several crystalline rings corresponding to the fcc $MgCu_2$ phase equiaxed with random orientations. Furthermore, the statistical analysis shows the uniform distribution of the nanocrystals with the average diameter of 6 nm.

Preferably, the structure 100 in one example embodiment of the present invention possesses a theoretical strength of 3.3 GPa and low modulus of 65 GPa. The 10-μm-thick homogeneous film with large area of 10 cm×10 cm was deposited in just one sputtering process, widens its industrial application in high strength MEMS devices, surface coatings with high wear resistance, and 3D printing structures.

The inventors have devised that the strength of crystalline material without amorphous phase may be increased as the grain size is reduced. This phenomenon is the so called Hall-Petch relationship. However, if the grain size is further reduced below a specific value (around 10 nm), the strength of the material could be decreased, as result of grain boundary sliding and softening mechanism.

Advantageously, the amorphous phase in the material in one example embodiment of the present invention may inhibit the grain boundary sliding. Accordingly, the strength may be further increased as the grain size further decreases below 10 nm. Preferably, the volume fraction of the crystalline phases and amorphous phase is ideally 2:1-1:2, because there is a compensation effect between grain boundary sliding for crystalline phase and shear transition effect for amorphous phase.

The inventors have further devised that if the size of the amorphous phase is larger, the shear band softening caused by shear transition may also decrease the strength of the material.

Turning now to the method for use in fabricating the metal material 100, the method includes the step of depositing a metal layer comprising a plurality of metal particles on a substrate, preferably with an alloy target being used in a magnetron sputtering process. The plurality of metal particles is arranged in a crystal structure having at least two phases including a crystalline phase and an amorphous phase.

Alternatively, any surface coating technology, such as but not limited to sputtering and evaporation, which allows an adjustment of the material cooling rate, may be applied to form the aforesaid two phases coating. These processes are simple yet low cost, and thus widen the application of the alloy coating product and also overcome the tough fabrication requirement of nanocrystalline materials.

Preferably, the alloy target may be a magnesium alloy target comprising magnesium, yttrium and copper which is fabricated by smelting. More preferably, the alloy target may be arranged with an atomic ratio of magnesium, cooper and yttrium of 65:25:10. Alternatively, co-sputtering of multiple targets of metal materials may be adopted.

In one embodiment, the method for use in fabricating a material with the theoretical strength comprising the steps of:

Step 1: Fabricating an alloy target for use in the sputtering process. Preferably, the raw material of the alloy target comprises a purity of higher than 99.9%. Preferably, the method of fabricating the alloy target may be smelting, molten melting or powder pressing.

Step 2: Washing a substrate to be deposited. The substrate is first placed into acetone for ultrasonic cleaning of 10 minutes. The substrate is then placed into alcohol for ultrasonic cleaning of 10 minutes. Subsequently, the alcohol on the surface is dried with nitrogen gun.

Step 3: Positioning the alloy target and the washed substrate into a sputtering cavity. Suitable parameters may be selected according to the heat index of the material for performing magnetron sputtering, thereby obtaining the material with the theoretical strength. Preferably, the sputtering vacuum pressure is lower than $5.5 \times 10^{-5}$ Pa, the substrate heating temperature is around 100 to 200° C., the deposition rate is 5 to 8 nm/min, and the substrate bias voltage is around −50 to −100 V.

In yet another embodiment, the method for use in fabricating a Mg-based nano-dual-phase glass-crystal comprising the steps of:

Step 1: Fabricating an alloy target with an atomic ratio of Mg, Cu and Y equals to 65:25:10. Preferably, the raw materials of the alloy target Mg, Cu and Y comprise a purity of higher than 99.9%. Preferably, the method of fabricating the alloy target may be smelting, molten melting or powder pressing.

Step 2: Monocrystalline sheet with a clean surface, regular glass sheet or alloy substrate is used as the substrate.

Preferably, the substrate is washed with the following steps: the substrate is first placed into acetone for 60 W ultrasonic cleaning of 10 minutes. The substrate is then placed into alcohol for 60 W ultrasonic cleaning of 10 minutes. Subsequently, the alcohol on the surface is dried with nitrogen gun.

Step 3: Positioning the alloy target and substrate into a sputtering cavity. The sputtering parameters are adjusted to the suitable parameters for performing magnetron sputtering, thereby obtaining the material with the alloy coat. Preferably, the sputtering vacuum pressure is lower than $5.5 \times 10^{-5}$ Pa, the Argon pressure is between 0.2 to 0.5 Pa, the substrate heating temperature is around 100 to 200° C., the deposition rate is 5 to 8 nm/min, and the substrate bias voltage is around −50 to −100 V.

Preferably, the target for sputtering may be a glass forming target, and the elements of the target are not limited to only Mg, Cu and Y. Alternatively, the composition of the target may also be $Mg_{65}Cu_{20}Zn_5Y_{10}$, $Mg_{57}Cu_{31}Y_{6.6}Nd_{5.4}$ and $Mg_{65}Cu_{15}Ag_{10}Y_{10}$, and the like.

Optionally, the fabrication method may also be co-sputtering with two or more targets. Any surface coating technology, such as but not limited to sputtering and evaporation, which allows an adjustment of the material cooling rate, may be applied to form the aforesaid two phases coating.

Figure 2:
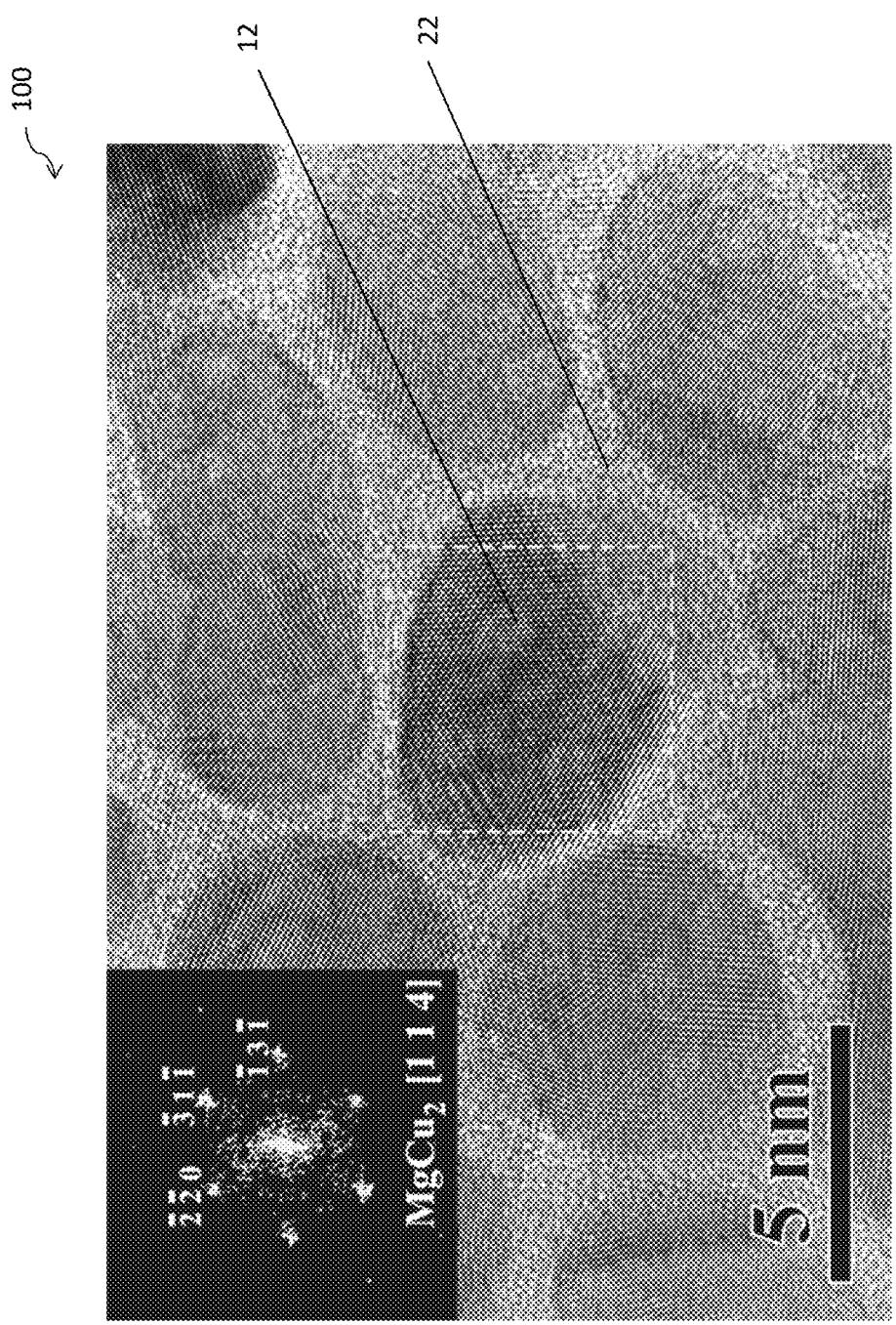
FIG. 2 is a high-resolution transmission electron microscopy (HRTEM) image of the Mg-based nano-dual-phase glass-crystal with theoretical strength.

With refer to FIG. 2, the nanograins with a diameter of around 6 nm are dispersed uniformly in the amorphous matrix, with a nanocrystal volume fraction of 56%, revealing an amorphous-nanocrystalline dual-phase structure. The inventors have devised that the Mg-based nano-dual-phase glass-crystal with theoretical strength is provided with a nanocrystalline dual-phase structure. The first crystalline phase may be spherical crystalline that are substantially free of dislocation and preferably, the grain size may be around 6 nm. On the other hand, the second phase may be an amorphous phase for surrounding the spherical crystalline and preferably, the grain size may be around 2 nm.

For instance, the inset of FIG. 2 is the fast Fourier transform (FFT) image of a $MgCu_2$ crystal oriented to the [1 1 4] zone axis. It shows that this kind of Mg-based material has a structure of $MgCu_2$ nanocrystalline phases embedded in the amorphous shells. Moreover, few dislocations exist in the nanocrystals, which reveals the low energy state of the nanocrystals. The cross-sectional TEM image shows the same structure as the plane-view image in FIG. 1b.

Preferably, the Mg-based material produced by magnetron sputtering has a homogeneous structure in 3D, which is very different from the granular/columnar structure of the traditional sputtered film. Such Mg-based material with the amorphous-nanocrystalline dual-phase structure could be called as nano-dual-phase glass-crystal (NDP-GC).

In one example embodiment, since the average composition of this NDP-GC is $Mg_{49}Cu_{42}Y_9$ (at. %) and the volume fraction of the $MgCu_2$ nanocrystals is 56%, the amorphous shells is calculated to be $Mg_{69}Cu_{11}Y_{20}$, which is a typical Mg-based glass forming composition. The composition calculation result corresponds well to the EDS result in the STEM analysis as shown in FIGS. 3 to 4.

As it would be appreciated by person skilled in the art, $Mg_{49}Cu_{42}Y_9$ is not a very good glass forming composition. The $MgCu_2$ phase is formed because of the appropriate heating in the sputtering process, leaving behind the relaxed Mg-enriched amorphous shell with the good glass forming ability (GFA). The Mg-based NDP-GC with one quasi "dislocation free" crystalline phase uniformly dispersed in the relaxed amorphous shell is achieved in just one deposition process, which reveals a self-assemble property of this NDP-GC structure.

Figure 3:
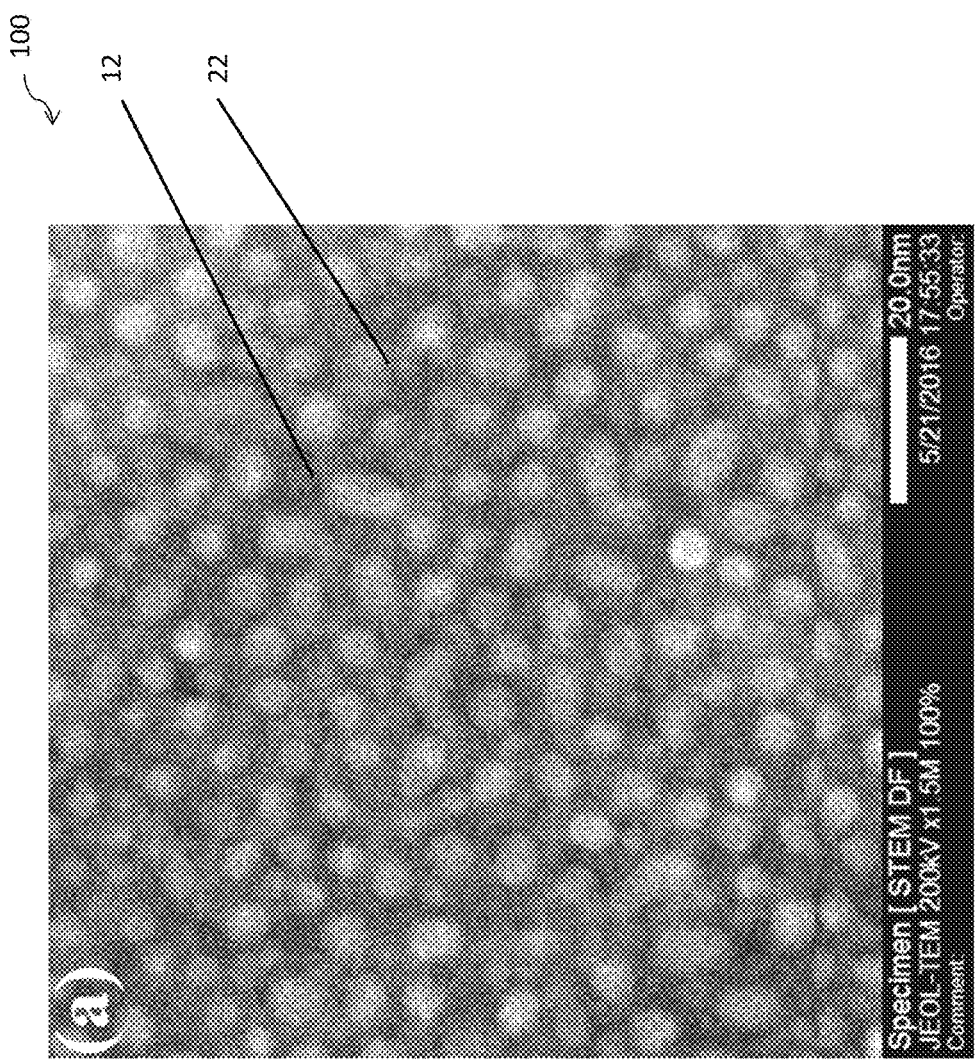
FIG. 3 is a scanning transmission electron microscopy (STEM) high-angle annular dark-field (HAADF) image of the Mg-based nano-dual-phase glass-crystal with theoretical strength.

With refer to FIG. 3, there is shown white and black complements, with each having a size of 6 nm and 2 nm respectively. The white complements correspond to the first crystalline phase, while the black complements correspond to the second amorphous phase. It would be appreciated by person skilled in the art that the complements in the HAADF directly reflect the atomic number of the elements. For instance, the white complement represents the heaver atoms, and on the other hand, the black complement represents the lighter atoms.

Figure 4:
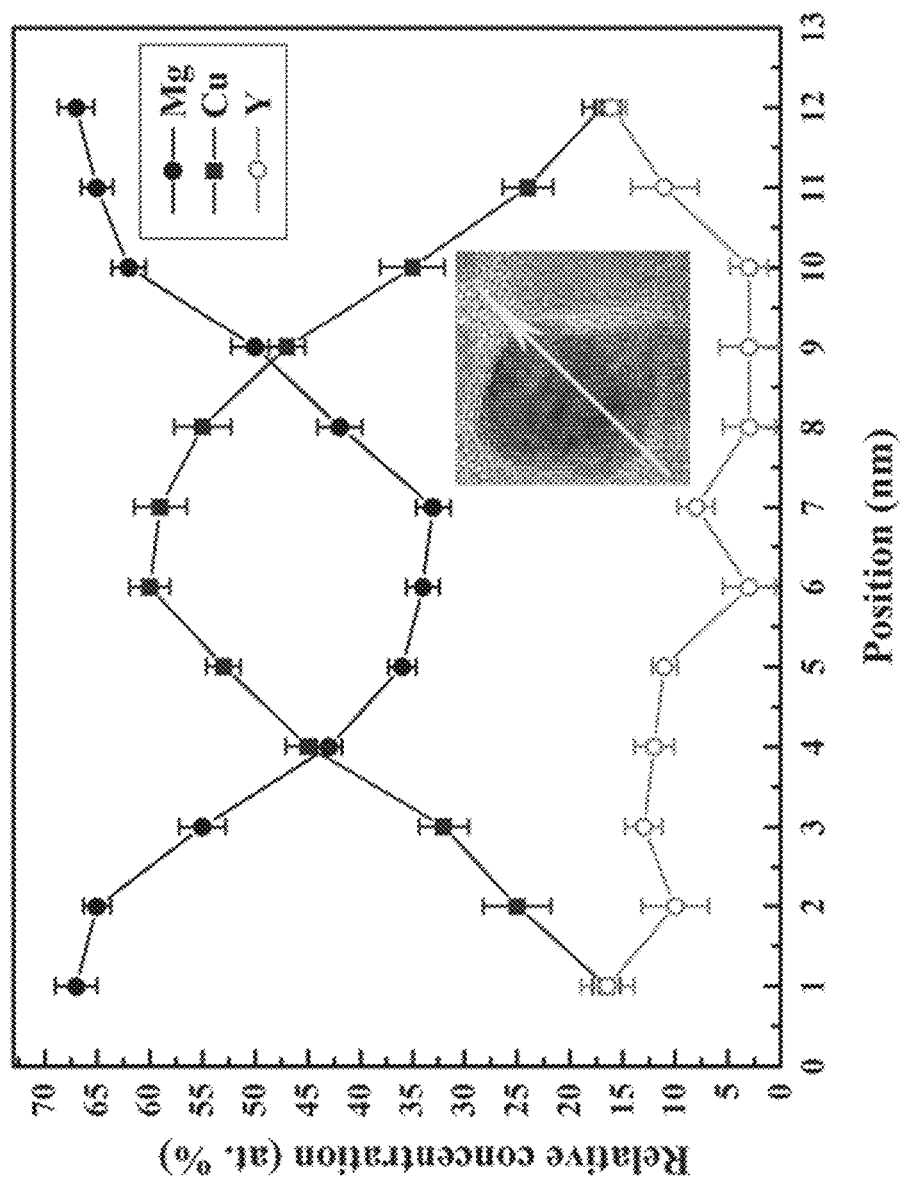
FIG. 4 is a STEM energy-dispersive X-ray spectroscopy (EDS) composition distribution of the nanocrystal within the amorphous shells.

With refer to FIG. 4, the nanocrystalline phase is a copper rich phase, and the amorphous phase is a magnesium rich phase. For instance, the composition distribution of the nanocrystal within the amorphous shells in one example embodiment of the present invention is indicated by the arrow in the inset of FIG. 4.

In one example embodiment, nanoindentation was introduced to determine the basic mechanical properties of this NDP-GC at first. The hardness of this Mg-based NDP-GC is 6.5±0.1 GPa, which is much higher than that of the most conventional Mg-based MG (around 4 GPa). For instance, the hardness of the Mg—Zn—Ca MG is 3.6 GPa. The very high hardness of the Mg-based NDP-GC may originate from the NDP structure with low energy state. The Young's modulus of Mg-based NDP-GC, Mg—Zn—Ca MG and Mg-based crystalline alloy (AZ31) is 65 GPa, 56 GPa and 50 GPa, respectively.

In order to investigate the mechanical response of the Mg-based nano-dual-phase glass-crystal, the in-situ SEM micro-compression tests were performed on the pillars. Each test was performed on 5 pillars to avoid data deviation. The size of the pillar was selected to be >1 μm to avoid the size effect. The engineering stress-strain curve was achieved by using the Young's modulus correction formula of the pillar.

Figure 5:
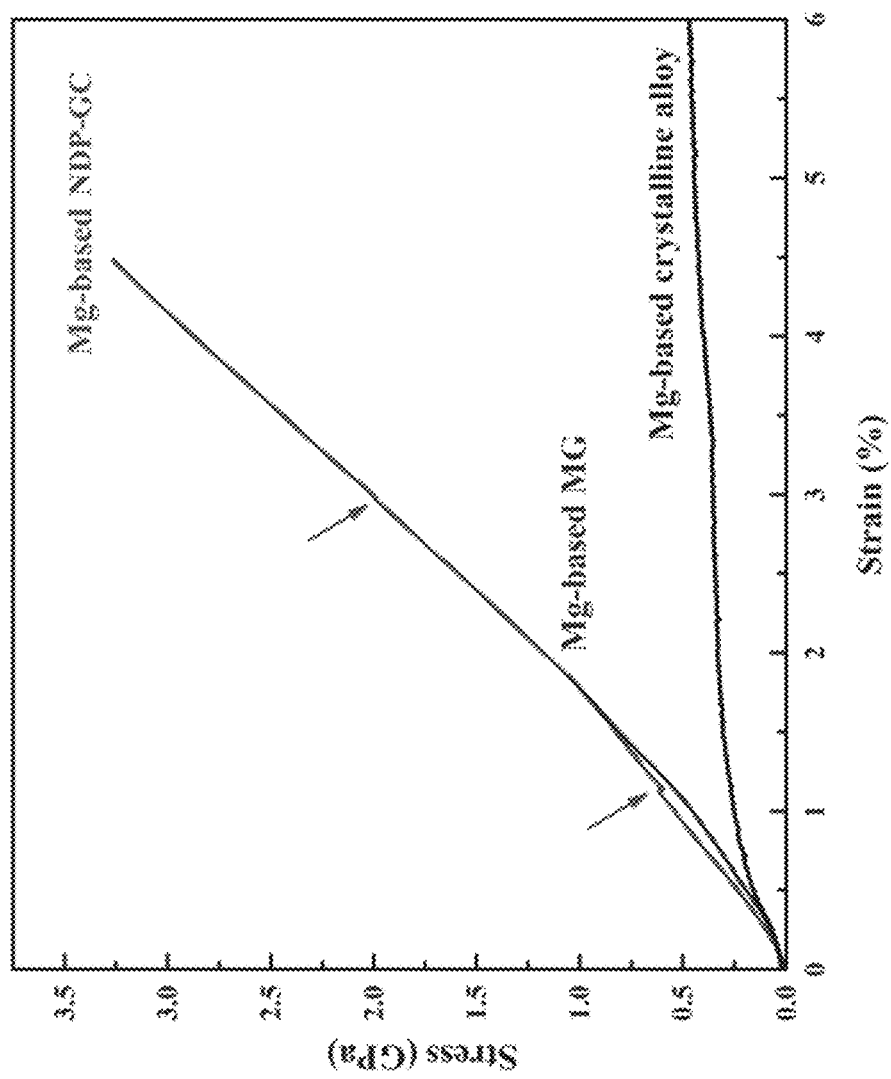
FIG. 5 is the engineering stress-strain curve of the micro-pillar Mg-based nano-dual-phase glass-crystal, the Mg-based metal glass, and Mg-based crystalline alloy with theoretical strength.

FIG. 5 shows the stress-strain curves of the micropillars with top diameter of ranging from 1 to 1.5 μm and aspect ratio ($H/D_0$) of 2-3. The Young's modulus coincides well with the nanoindentation result. The conventional Mg-based crystalline alloy has a yield stress of only 0.16 GPa, ultimate stress of 0.46 GPa and a total strain of >6%. The Mg-based MG has a yield stress of around 1 GPa and a strain limit of around 2%, which correspond well to the other reports for the mechanical properties of Mg-based BMG. In contrast, the Mg-based NDP-GC has an ultimate stress of 3.3 GPa and strain limit of 4.5%.

Moreover, the Mg-based NDP-GC has an elastic-like behavior before the final failure, and surprisingly, the strength is up to the theoretical strength regime of E/20. With a careful investigation, small pop-in events could be seen on the stress-strain curve of the Mg-based NDP-GC.

It would be appreciated by person skilled in the art that the strain burst/pop in the stress-strain curves of MG corresponds to the shear band generation process. The conventional Mg-based MG generates only one major shear plane upon yielding and then the catastrophic failure takes place as a result of the instability of the shear band. Advantageously, the shear banding behavior of the Mg-based NDP-GC is completely different from that of Mg-based MG, which would be discussed in the following paragraph.

Figure 6:
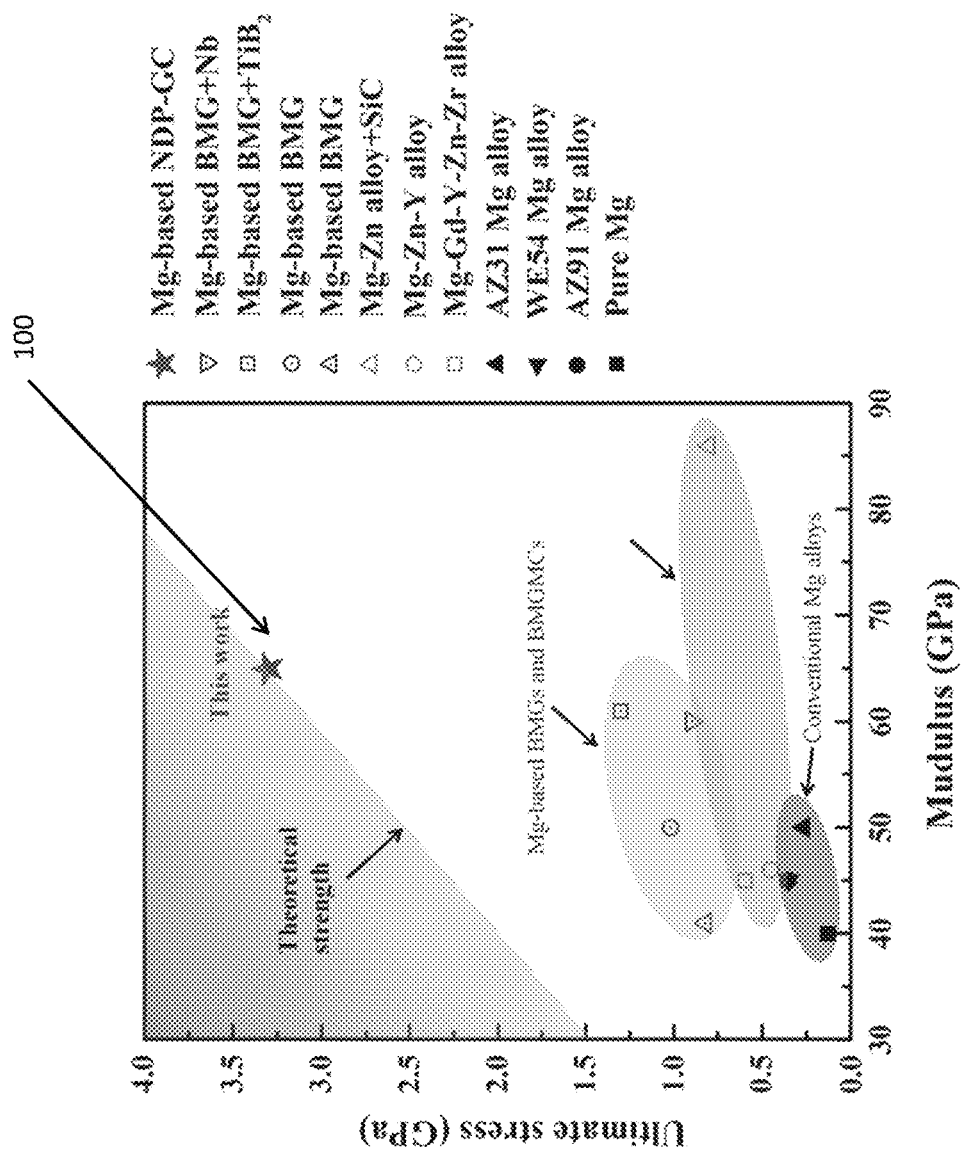
FIG. 6 shows the relationship between the ultimate stress and elastic modulus of the Mg-based nano-dual-phase glass-crystal compared with other conventional Mg alloys, NC Mg alloys, Mg-based bulk metallic glasses (BMGs) and Bulk metallic glass matrix composites (BMGMCs)

FIG. 6 shows the excellent mechanical property of the Mg-based NDP-GC compared with other Mg alloys. The strength-modulus relationship of the Mg-based NDP-GC lies on the theoretical strength regime of E/20, which is far from the MG regime and nanocrystal (NC) regime. In this embodiment, the related ultimate stress and modulus of the Mg-based nano-dual-phase glass-crystal are within the theoretical strength material region. The inventors have discovered that most of the existing materials with a strength approximately the same as the theoretical strength are small nano grading materials such as 8 nm, 75 nm, 220 nm. Advantageously, the testing size of the Mg-based nano-dual-phase glass-crystal is within micro grading, which shows that the strengthening is not caused by varying the size of the material.

The inventors have also devised that the conventional near-ideal strength materials generally exist in their nano-sized form, which presents a size effect. In the present invention, however, the microsized pillar was extracted from a large size of film with 100 mm×100 mm×10 μm, which is several orders larger than the conventional materials, and the diameter of the pillar is 6-162 times of that in the previous test on conventional materials. The size of the pillar is not in the conventional size depended strength region i.e. hundreds of nanometers.

Figure 8:
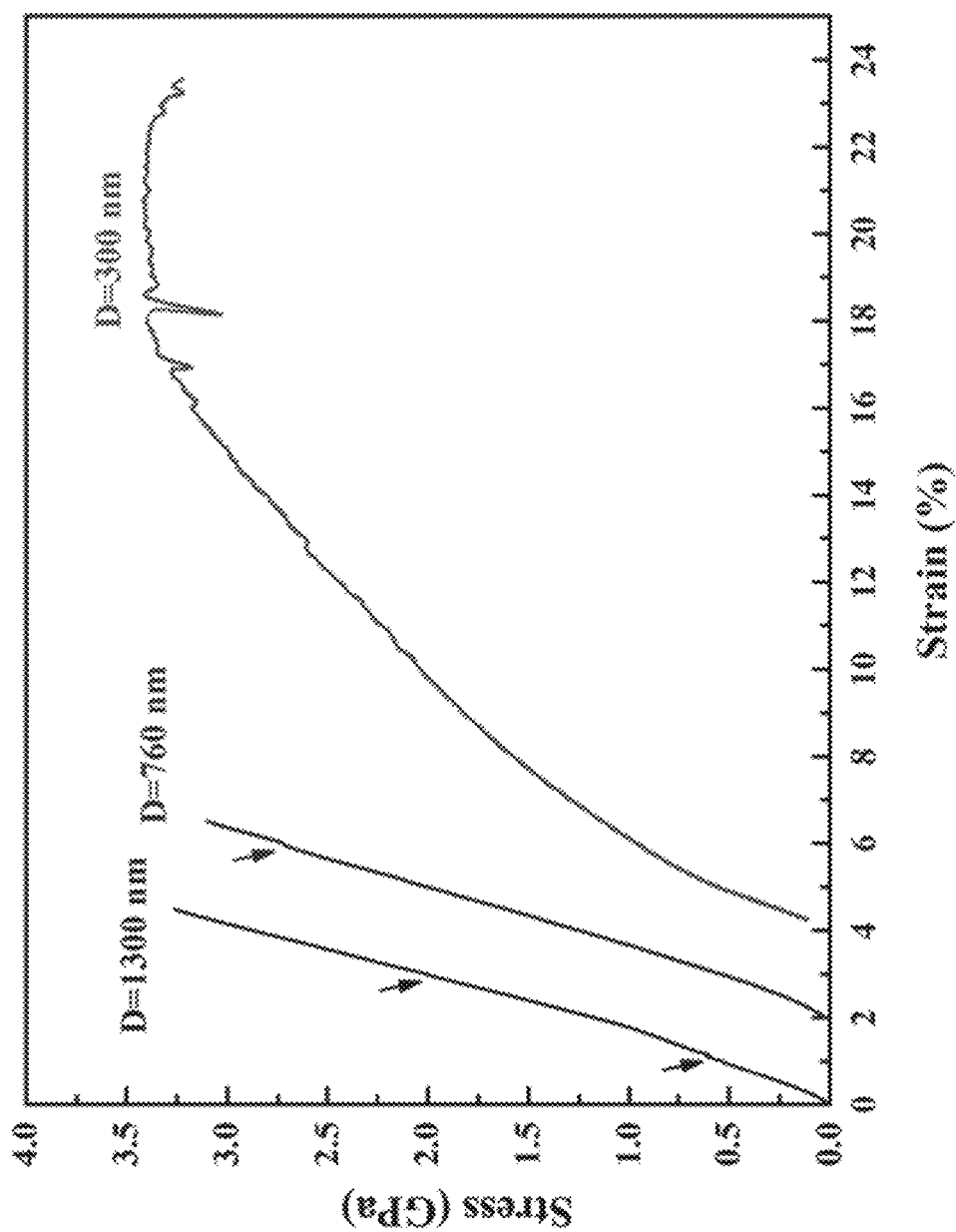
FIG. 8 is a micro-compressive stress-strain curves for the Mg-based NDP-GC pillars with the diameter of 1300 nm, 760 nm and 300 nm.

The inventors have further devised that the strength of the pillars with submicro size is not affected by its size either, as shown in FIG. 8. The arrows in FIG. 8 indicate the positions of pop-in.

Figure 7:
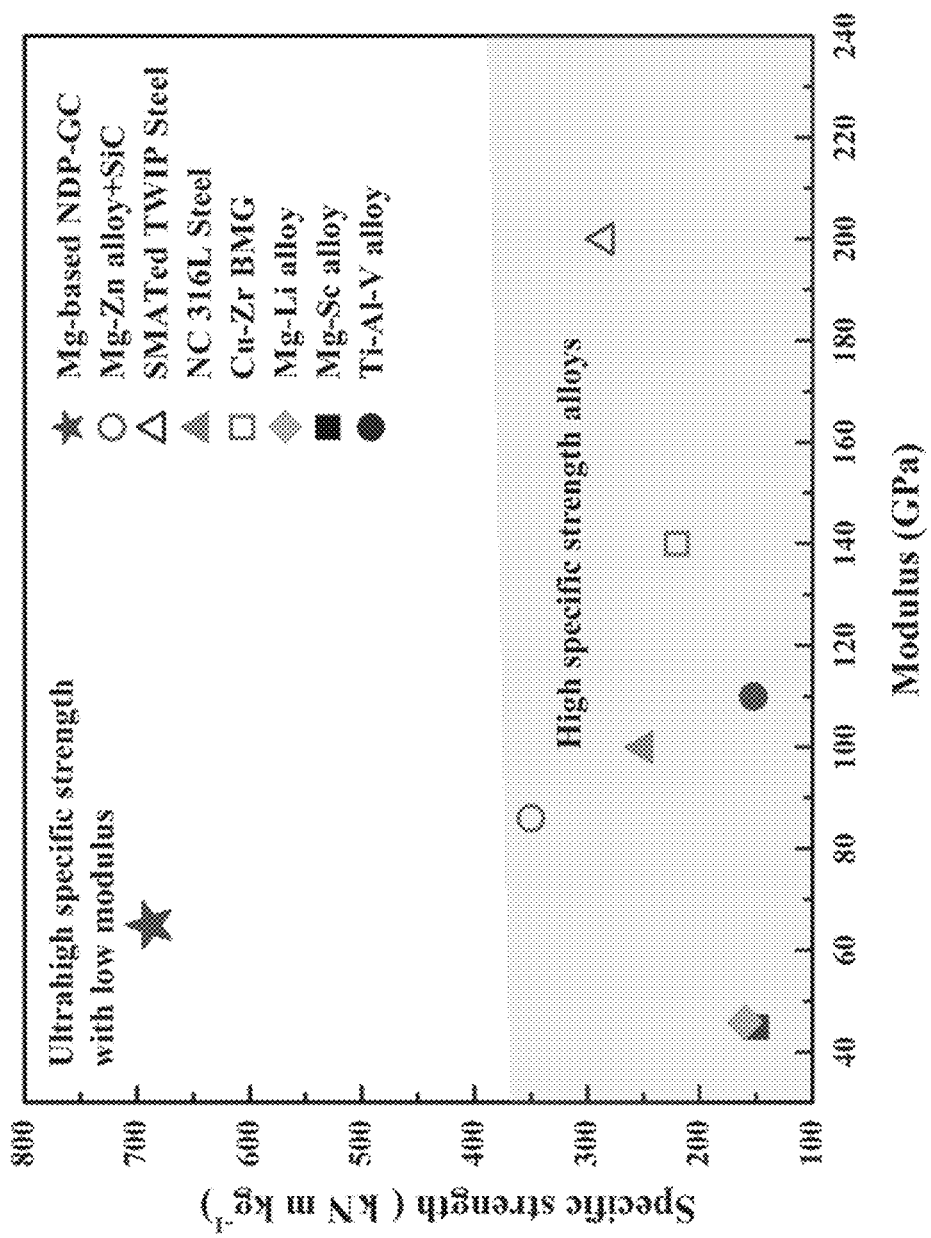
FIG. 7 shows the relationship between the specific strength and elastic modulus of the Mg-based nano-dual-phase glass-crystal compared with other alloys.

Preferably, the quasi "dislocation free" nanocrystals and fully relaxed amorphous shells contribute to the theoretical strength without size effect. Preferably, the Mg-based NDP-GC, as shown in FIG. 7 has a low modulus of 65 GPa, which is comparable to that of other Mg alloys, shown in FIG. 6. However, the strength is several times higher than those alloys and is the highest among those of the ever reported Mg-based alloys. Furthermore, as a result of low density of Mg, the specific strength of the Mg-based NDP-GC is ultrahigh compared with other high specific alloys shown in FIG. 7.

The inventors have yet further devised that different from the stick-slip behavior of MG under compression, there is little stress drop after each small pop-in event for the Mg-based NDP-GC, i.e., the stress retains the same value and elastic behavior is recovered after pop-in. The shear band is generated after each pop-in. However, when a shear band is encountered with a specific $MgCu_2$ nanocrystal, its propagation is impeded by the nanocrystal, as shown in FIG. 9, image (c).

Figure 9:
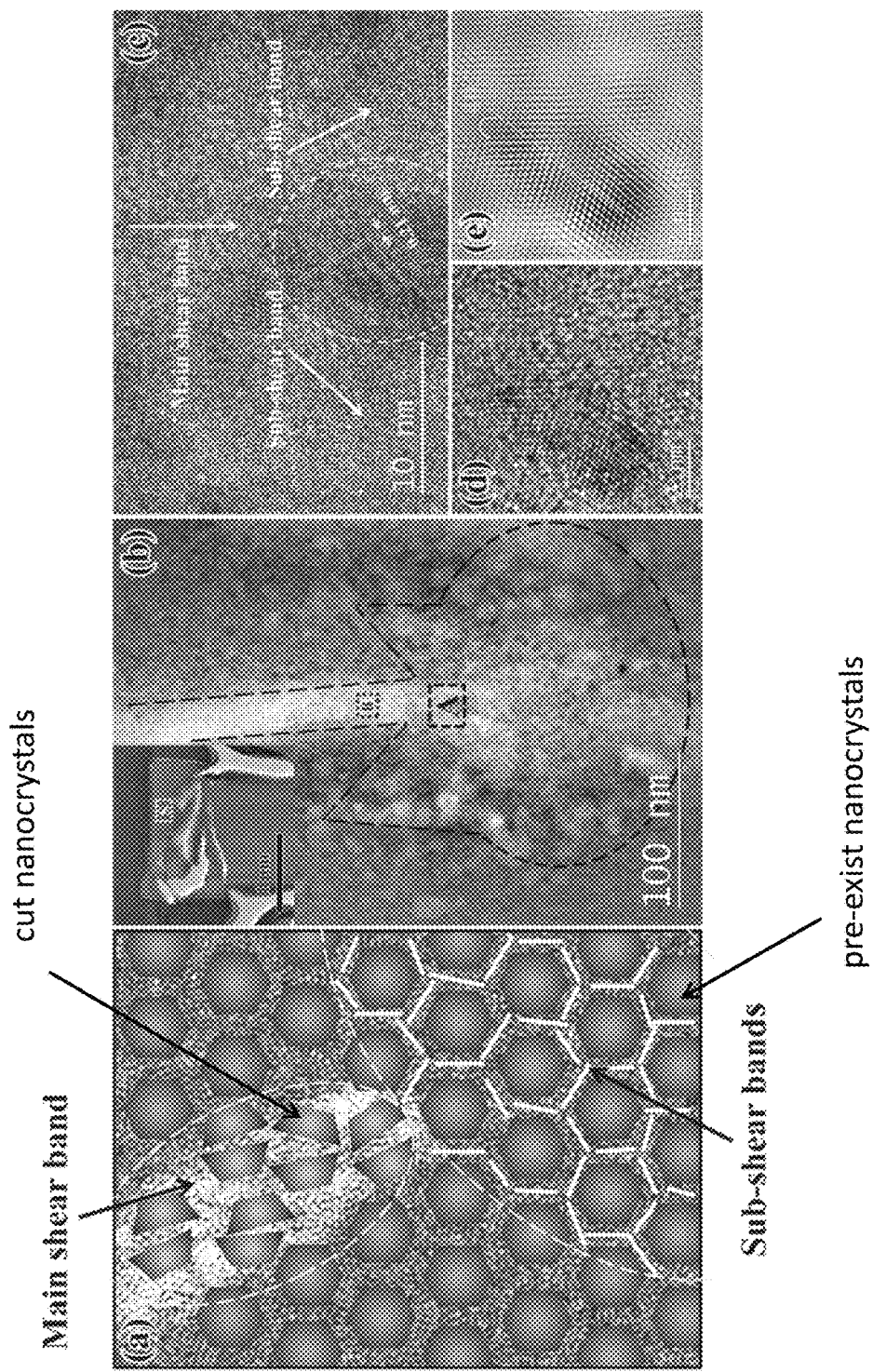
FIG. 9 provides various images of the shear band, where (a) is an illustrated mechanism, showing the main shear band is impeded by nanocrystals ahead and the nanocrystals inside the initial shear band are cut and rotated, (b) is a cross-sectional TEM image of the area near an initial shear band tip, together with the inserted overall image of the pillar after micro-compression, showing the initial shear band becomes to be radiation shaped multiple embryonic shear bands, (c) is a HRTEM image of the "A" area at the tip of the initial shear band indicated in image (b), showing the initial shear band is arrested by a $MgCu_2$ nanocrystal (evidenced by (2 2 2) plane with 0.21 nm plane distance), generating two sub-shear bands, (d) is a HRTEM image of the "B" area inside the initial shear band, showing a $MgCu_2$ nanocrystal is cut by the shear band, and (e) is an IFT image of image (d), showing the two parts of the $MgCu_2$ nanocrystal has a misorientation of 40°.
Figure 10:
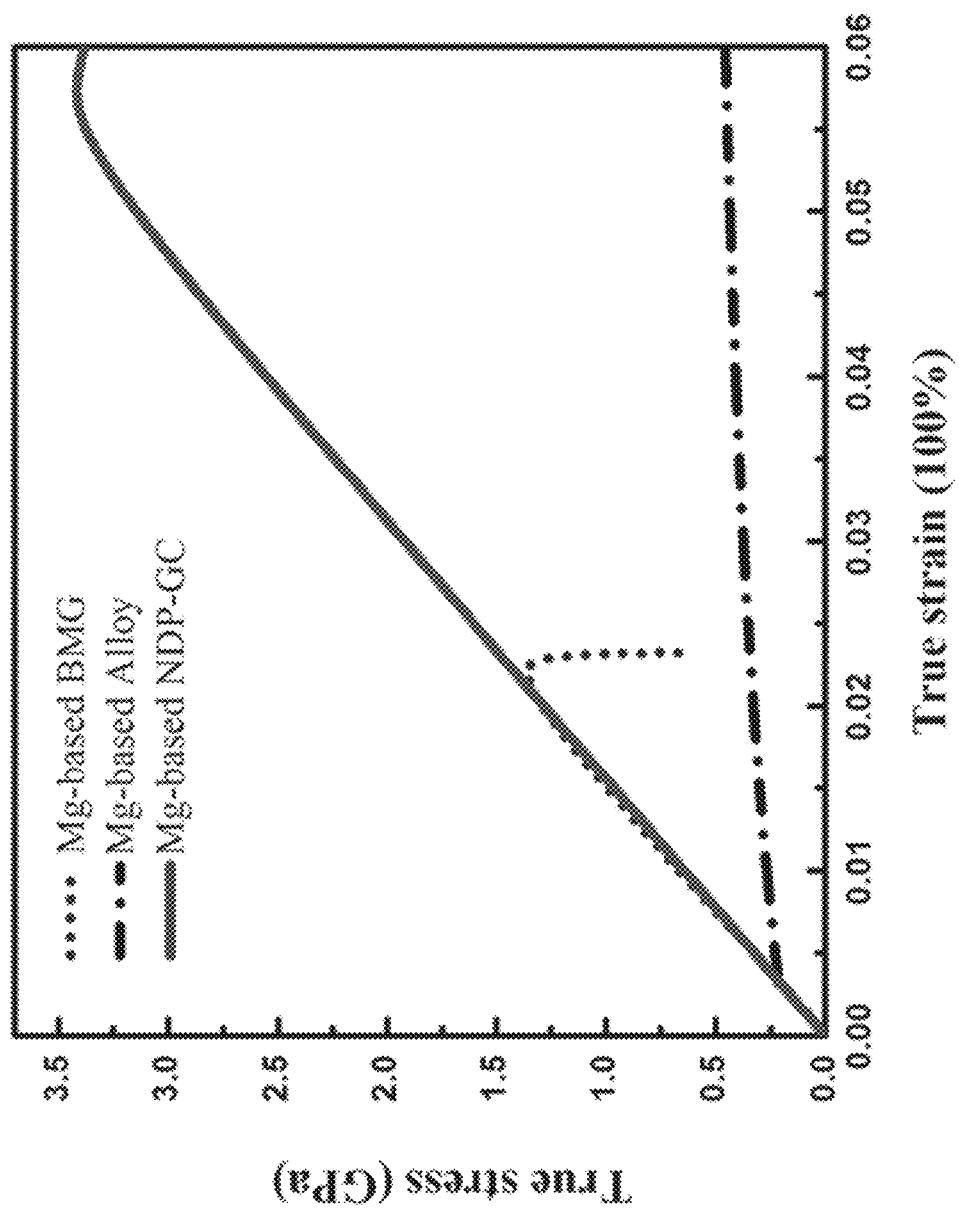
FIG. 10 is the simulated stress-strain relations for Mg-based BMG, Mg-based alloy and Mg-based NDP-GC based on the constitutive model in accordance with the invention.
Figure 11:
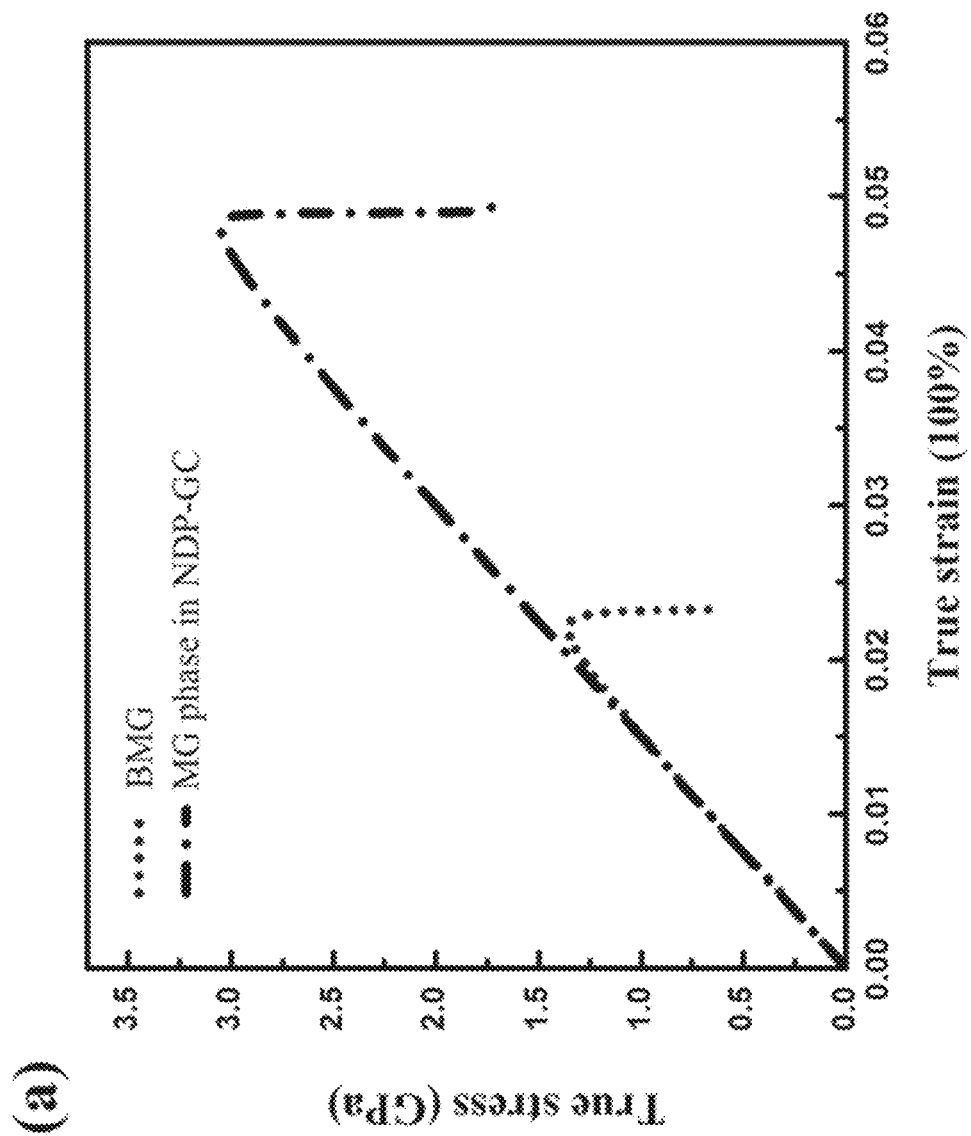
FIG. 11 shows the constitutive relations varied with the strain for the Mg-based BMG and the Mg-base MG phase in NDP-GC.
Figure 12:
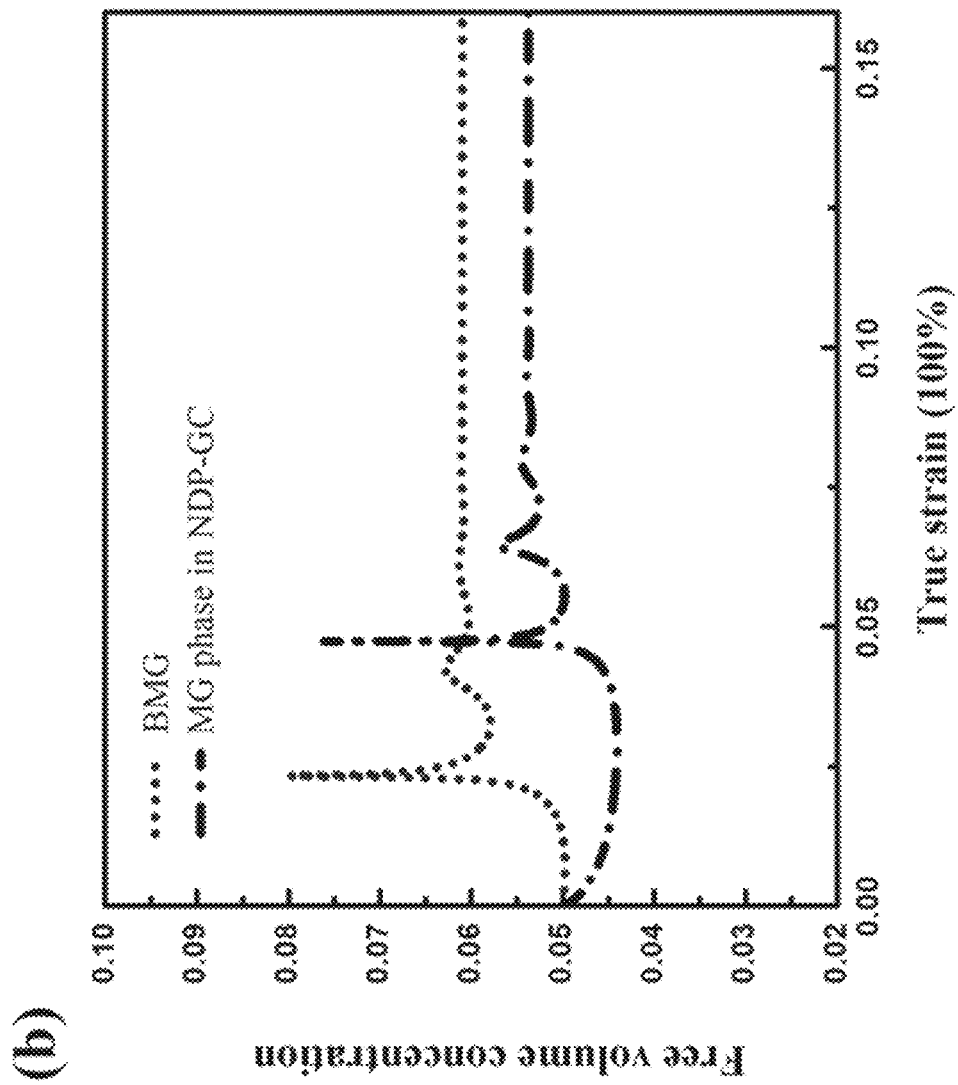
FIG. 12 shows the free volume concentration varied with the strain for the Mg-based BMG and the Mg-base MG phase in NDP-GC.
Figure 13:
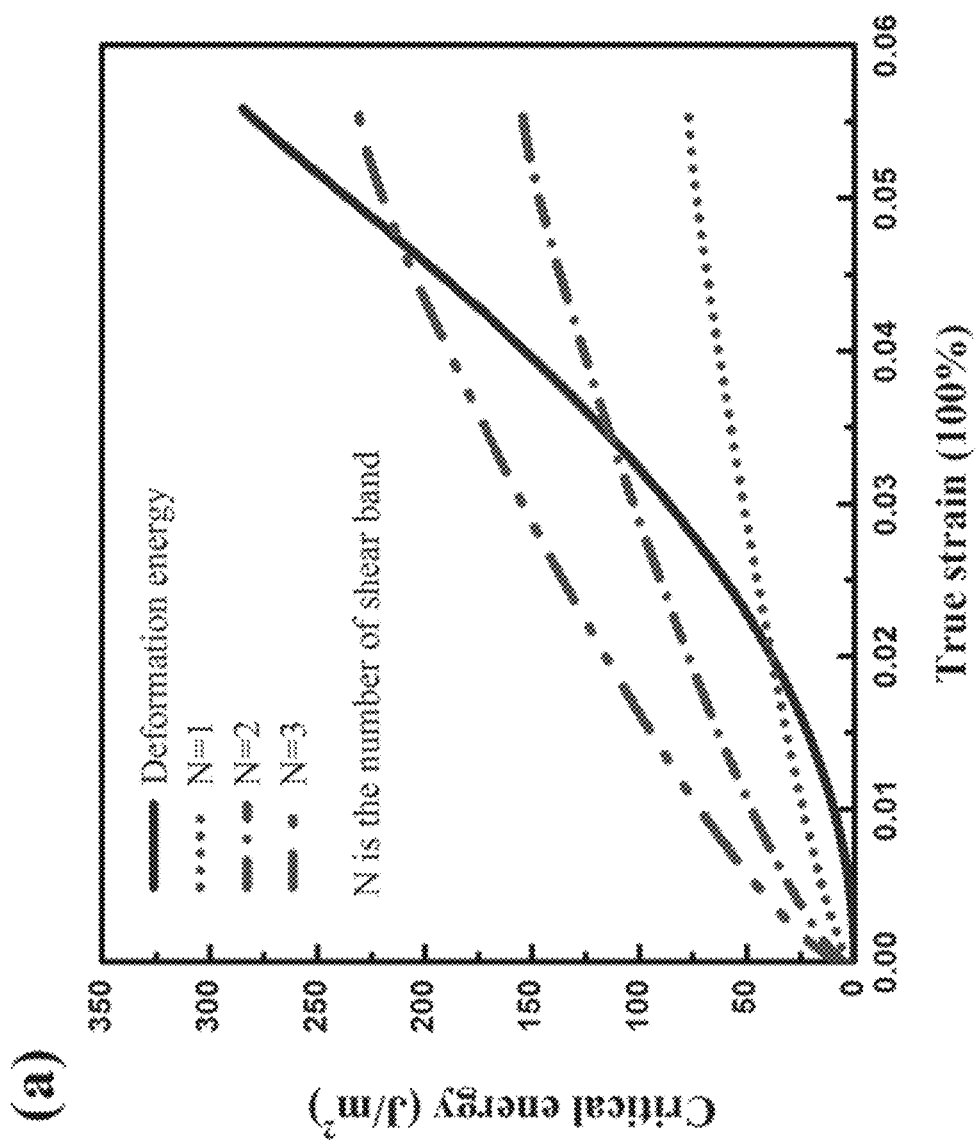
FIG. 13 shows the critical energy dissipated within the initiated shear band of the Mg-based NDP-GC and the deformation energy varied with the strain.
Figure 14:
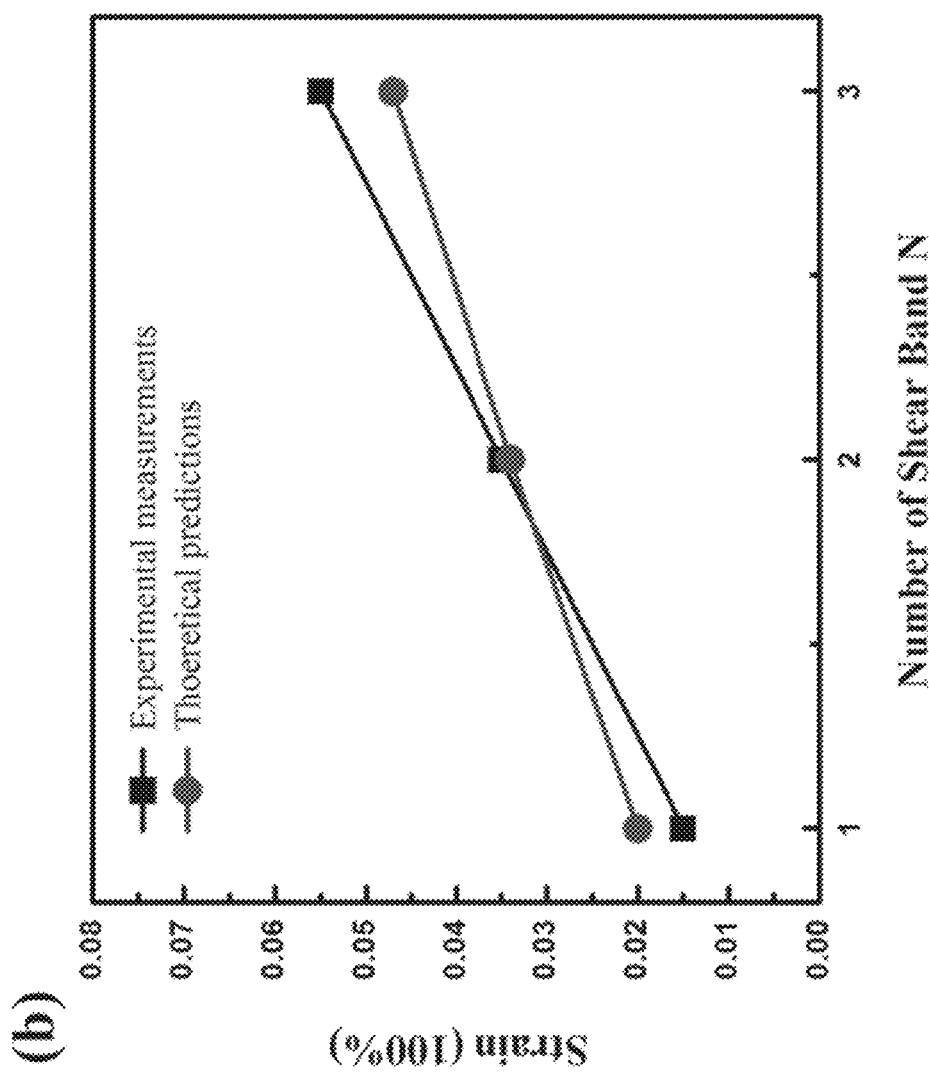
FIG. 14 shows the relation between the critical strain at which one more shear band is created.

As shown in FIG. 9, image (b), the propagation of that shear band is arrested, generating two sub-shear bands, then the radiation shaped multiple embryonic shear bands are formed, which facilitates the strain retaining after pop-in. The size of the main shear band in FIG. 9, image (b), is around 20 nm, which is very close to that of the nanocrystals (6 nm) in the Mg-based NDP-GC. Therefore, the amorphous/nanocrystal structure could be recovered immediately to carry the additional local stress after the shear band is arrested.

From the HRTEM investigation inside the initial shear band as shown in FIG. 9, image (e), the inventors has noticed that the volume of the amorphous part is expanded, as a result of the free volume generation by shear transition of the amorphous material. It can be seen from FIG. 9, images (d) and (e), that some of the $MgCu_2$ nanocrystals are cut by the shear band. Moreover, the cut part is rotated by 40° after shear transition.

In spite of the softening effect by larger free volume, it is partly dissipated by the deformation of the $MgCu_2$ nanocrystals, which facilitates the stress retaining phenomenon after each pop-in event. Then the elastic behavior is recovered until the next main shear band is generated. This deformation mechanism of the Mg-based NDP-GC is also analyzed by constitutive modeling as shown in FIGS. 10 to 14.

As devised by the inventors, the traditional strength of the around 6-nm-sized nanocrystalline $MgCu_2$ should lie in the reverse Hall-Petch part. However, the softening effect does not appear in the present invention. The TEM observation and constitutive modeling reveal that the traditional grain boundary sliding and softening mechanism are replaced by embryonic multiple shear banding behavior in the amorphous shell. As such, the smaller nanocrystalline cores are able to contribute to the higher strength. Preferably, the mechanism of initial shear band arresting by the nanocrystalline $MgCu_2$ and the strain hardening of the nanocrystals promotes the theoretical strength.

In one alternative embodiment, the metal material 100 may be provided as a Mg-based nano-dual-phase glass-crystal having an amorphous-nanocrystalline dual-phase structure of approximately 6 nm-sized $MgCu_2$ phases uniformly embedded in the approximately 2-nm-thick MG-enriched amorphous shells that is fabricated by magnetron sputtering. Such structure may possess a theoretical strength of 3.3 GPa and low modulus of 65 GPa. The 10 μm thick homogeneous film with large area of 10 cm×10 cm may be deposited in a single sputtering process.

Advantageously, the material provided in the present invention may include a size of 100 mm×100 mm×10 μm, which may be adopted in large area application.

Advantageously, the fabrication method in the present invention uses magnetron sputtering of one time deposition. The composition and thickness of the nano-dual-phase glass-crystal structure is under control by adjusting the sputtering parameter.

These embodiments may be advantageous in that metallic glass material may be widely adopted in different applications, such as in the metallic film area, high strength MEMS devices, surface coatings with high wear resistance, and 3D printing structures or the like.

Preferably, the present invention could be coated on the surface of a 3D printed structure and 3D printing structure may be fabricated by this newly developed material alone. The 3D printing structure may be fabricated by the novel material in one example embodiment of the present invention through the technique of lithography and sputtering. For instance, it may be possible to use photoresist and the specific mask to fabricate the hollow 3D structure, and then deposit the material into the hollow 3D structure. After lifting off the remained photoresist, a 3D structure formed by the material in the example embodiments of the present invention could be achieved.

Advantageously, the dual phase structure may be suitable for various large area applications. Such novel structure may be superior then other structures such as amorphous structures, crystalline structures and single crystalline structures in different aspects.

As discussed above, these conventional material structures do not provide the required strong mechanical properties, or may only be fabricated using costly fabrication process with relatively low fabrication yield, thus hindering the applications of the conventional metal glass structures over a large area. The present invention provides an alternative solution to fabricate a material that may provide a steady structure with a high and consistent strength for large area applications by using a more cost effective process.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A metal material comprising a plurality of metal particles arranged in a structure having at least two phases including a crystalline phase and an amorphous phase; wherein the crystalline phase is arranged to form a plurality of spherical crystalline structures and the amorphous phase is arranged to surround the spherical crystalline structures such that the spherical crystalline structures are substantially free of dislocation.

2. The metal material in accordance with claim 1, wherein the crystalline phase includes a nanocrystalline phase and the amorphous phase includes a nanoamorphous phase.

3. The metal material in accordance with claim 1, wherein the plurality of metal particles are further arranged to form a plurality of amorphous shells.

4. The metal material in accordance with claim 3, wherein at least a portion of the plurality spherical crystalline structure is surrounded by an amorphous shell.

5. The metal material in accordance with claim 3, wherein each of the plurality of amorphous shells includes a size smaller than or equal to 10 nm.

6. The metal material in accordance with claim 1, wherein a plurality of spherical crystalline structures includes a size smaller than or equal to 10 nm.

7. The metal material in accordance with claim 1, wherein a ratio between a portion of metal particles arranged in the crystalline phase and a portion of metal particles arranged in the amorphous phase is substantially ranged at 1:2 to 2:1.

8. The metal material in accordance with claim 7, wherein the ratio is substantially equal to 1:1.

9. The metal material in accordance with claim 1, wherein the at least two phases are distributed uniformly in three dimensional directions in the structure.

10. The metal material in accordance with claim 1, wherein the structure includes a material strength higher than or equal to E/20, wherein E represents an elastic modulus of the metal material.

11. The metal material in accordance with claim 1, wherein the structure is arranged to sustain a maximum stress of 3.3 GPa.

12. The metal material in accordance with claim 1, wherein the structure includes a metallic glass structure.

13. The metal material in accordance with claim 1, wherein the plurality of metal particles include magnesium.

14. The metal material in accordance with claim 13, wherein the plurality of metal particles further includes at least one of yttrium and copper.

15. The metal material in accordance with claim 14, wherein the crystalline phase is copper-rich and the amorphous phase is magnesium-rich.

* * * * *